WIDE-RANGE AUTOMATIC GAIN CONTROL
Filed April 27, 1956
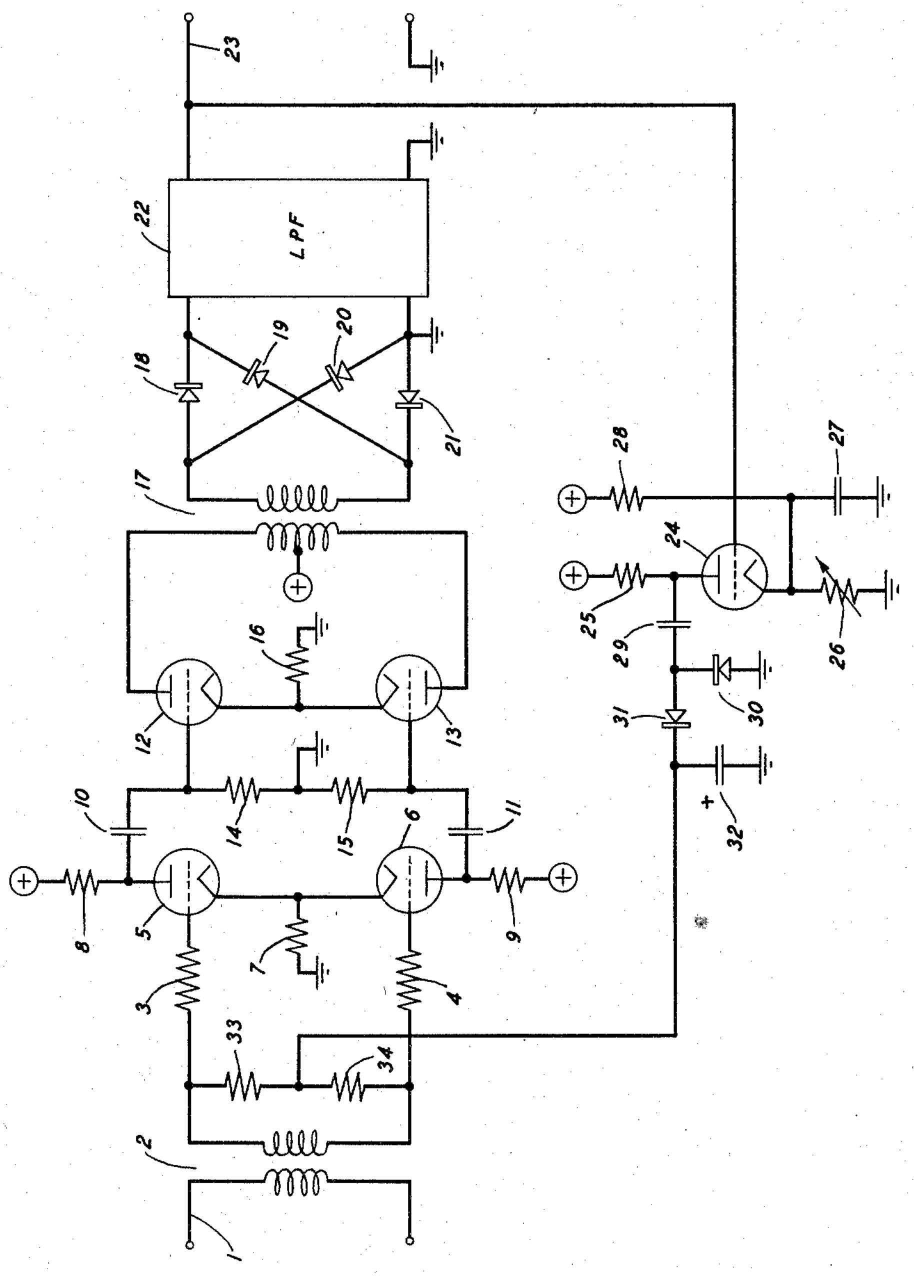
INVENTOR
R.O. SOFFEL
BY R. B. Ardis
ATTORNEY 2,910,550

WIDE-RANGE AUTOMATIC GAIN CONTROL

Robert O. Soffel, Hastings on Hudson, N.Y., assignor to Bell Telephone Laboratories, Incorporated, New York, N.Y., a corporation of New York Application April 27, 1956, Serial No. 581,071

2 Claims. (Cl. 179—171)

This invention relates generally to automatic gain control and more particularly, although in its broader aspects not exclusively, to vacuum tube amplifier automatic gain control circuits for use in connection with signals which are subject to extremely wide amplitude variations.

A principal object of the invention is to free wide range automatic gain control circuits from dependence upon the use of special remote-cutoff or variable-mu types of vacuum tubes for successful operation.

Another and more particular object is to increase substantially the volume range of vacuum tube amplifier automatic gain control operation which is possible without the use of special tube types for control purposes.

Still another object of the invention is to improve the linearity of the automatic volume control possible over extremely wide ranges of signal amplitude without special remote-cutoff or variable-mu tubes.

In the past, automatic gain control has usually been secured in a vacuum tube amplifier through the application of a negative bias to the control grid of at least one amplifier tube and the control of the magnitude of that negative bias by the average level of the amplified signal energy in the amplifier output circuit. Changes in the negative bias at the control grid of the amplifier tube produce corresponding changes in the gain of the tube and serve substantially to eliminate fluctuations in the average level of the signal energy delivered to the amplifier output circuit. Such automatic gain control arrangements do, however, generally require special remote-cutoff or variable-mu amplifier tubes for the controlled amplifier stages if they are to be subjected to wide input signal amplitude variations. When the range of input signal amplitude variation is large, linearity has been found to deteriorate quite severely if tubes of the remote-cutoff or variable-mu type are not employed.

In accordance with the present invention, automatic gain control is obtained by applying a positive, rather than a negative, bias to the control grid of at least one amplifier stage and varying its magnitude under the control of changes in signal level in the amplifier output circuit. The positive grid bias causes grid current to flow in the controlled amplifier tube and the internal impedance between the control grid and the cathode to vary in a manner substantially inversely proportional to changes in magnitude of the bias. In this manner, the shunt loss across the amplifier input circuit is varied rather than the gain of the amplifier stages themselves. Wide range automatic gain control is achieved without the use of special tube types for control purposes and substantial linearity is preserved.

In many of its principal embodiments, the invention takes the form of a push-pull vacuum tube amplifier, means to rectify at least part of the amplified signal energy appearing in the amplifier output circuit, means to store the rectified signal energy for at least several signal periods in order to prevent the control voltage from following instantaneous variations in signal amplitude, and means to apply the stored control voltage to the control grid of the first stage of amplification with the polarity required to provide a positive bias. The push-pull amplifier functions in the well known manner to cancel much of any distortion that is introduced by the operation of the automatic gain control circuit. The automatic gain control circuit, on the other hand, functions without the aid of any special remote-cutoff or variable-mu tubes to control the gain of the amplifier over an extremely wide range of input signal amplitudes.

In addition to providing the gain-correcting voltage with the polarity necessary to provide a grid current producing positive bias, the present invention features a resistance at least several times larger than the amplifier tube internal grid cathode impedance connected between the gain-correcting signal storage means and the control grid of each controlled amplifier tube. Since the internal grid-cathode impedance of each of the controlled amplifier tubes drops sharply when grid current is drawn, this additional resistance serves to extend the discharge time of the storage means over the required several signal periods. At the same time, the resistance serves to limit the flow of grid current to a safe level and prevent damage to the grid structure of the controlled amplifier tube.

A more complete understanding of the invention may be secured from a study of the following detailed description of the specific embodiment illustrated in the drawing.

The illustrated embodiment of the invention is a two-stage push-pull vacuum tube amplifier demodulator with automatic gain control. Pulse-modulated carrier frequency signals are supplied from an incoming transmission line 1 to the primary winding of an input transformer 2. The opposite ends of the secondary winding of transformer 2 are connected through a pair of large resistors 3 and 4 to the control grids of a pair of triodes 5 and 6. Triodes 5 and 6 form the first stage of the push-pull amplifier and have their cathodes connected together and returned to ground through a resistor 7. The anode of tube 5 is connected to a positive anode supply voltage source through an anode resistor 8, while that of tube 6 is similarly connected through an anode resistor 9.

The output from the first stage of amplification in the illustrated embodiment of the invention is taken from the anodes of tubes 5 and 6 and connected through a pair of coupling capacitors 10 and 11 to the control grids of a pair of triodes 12 and 13. Tubes 12 and 13 form the second stage of the push-pull amplifier and have their control grids returned to ground through a pair of resistors 14 and 15. The cathodes of tubes 12 and 13 are connected together and returned to ground through a common cathode resistor 16. The anodes of tubes 12 and 13 are connected to opposite ends of the primary winding of an output transformer 17. The mid-point of the primary winding of transformer 17 is connected to the same source of direct potential as the anodes of tubes 5 and 6.

The output of the two-stage push-pull amplifier in the embodiment of the invention under discussion is taken from the secondary winding of output transformer 17 and passed through a full wave rectifier type of demodulator composed of four semiconductor diodes 18, 19, 20 and 21. The output of the demodulator is, in turn, passed through a low-pass filter 22 to an outgoing transmission line 23.

The automatic gain control circuit in the illustrated embodiment of the invention includes a triode vacuum tube 24 connected to function both as an amplifier and as a peak detector. The anode of tube 24 is connected to a positive direct voltage supply through an anode resistor 25, while the cathode is returned to a voltage divider consisting of an adjustable cathode resistor 26 and a resistor 28 connected in series between ground and the positive anode supply. The cathode of tube 24 is by passed to ground by a capacitor 27.

Output is taken from the anode of tube 24 through a coupling capacitor 29 and supplied to a rectifying and smoothing network made up of a pair of diodes 30 and 31 and a storage capacitor 32. The output of the rectifying and smoothing network is connected directly to the junction between a pair of resistors 33 and 34, which are connected in series directly across the secondary winding to provide the proper termination for input transformer 2. Capacitor 29 and diode 31 are connected in series between the anode of tube 24 and the junction of resistors 33 and 34, with capacitor 29 nearest the anode of tube 24. Diode 31 is poled for easy current flow toward the junction of the two resistors, and the second diode 30 is connected between ground and the common point between diode 31 and capacitor 29. Diode 30 is poled for easy current flow toward diode 31, and storage capacitor 32 is returned to ground from the other side of diode 31. In addition to functioning as a rectifying and smoothing network, diodes 30 and 31 and capacitors 29 and 32 also serve as a voltage doubler.

Triode vacuum tubes 5, 6, 12 and 13 form a substantially conventional two-stage push-pull amplifier. Their output is full-wave rectified by the demodulator formed by diodes 18, 19, 20 and 21 and fed through low-pass filter 22 to complete the detection process. When the carrier wave being supplied over line 1 to the primary winding of input transformer 2 is modulated with a positive-going pulse, a corresponding positive-going pulse appears at the control grid of amplifier tube 24. This tube is made a peak detector by the positive bias on the cathode from resistor 28 and variable gain control resistor 26. This positive bias holds tube 24 cut off until the detected pulse peak reaches the conducting point. At this instant, the anode of tube 24 swings negative, charging coupling capacitor 29 through diode 30. When tube 24 is again cut off, its anode swings positive, discharging capacitor 29 through diode 31 into storage capacitor 32. In this manner, storage capacitor 32 attains a positive charge which holds a reverse bias on diode 31. The same positive charge on storage capacitor 32 supplies a positive bias to the control grids of tubes 5 and 6, causing grid current to flow and the internal grid-cathode resistances of the tubes to drop sharply. Storage capacitor 32 then discharges through resistors 3 and 4 which, in accordance with a feature of the invention, function both to give the desired time constant on the discharge and to protect the grids of tubes 5 and 6 against damage by too great a flow of grid current.

The discharge time of storage capacitor 32 is fixed by resistors 3 and 4 to extend over at least several signal periods in order to prevent the changes of loss in the grid-cathode paths of tubes 5 and 6 from following the instantaneous variations in amplitude of the incoming pulse modulated carrier wave. The discharge time should be long enough to prevent the gain of the amplifier from changing significantly from one signal pulse to the next. In general, this results in a time constant which may be as much as a hundred times the maximum interval between signal pulses.

The automatic gain control action featured by the invention follows as a consequence of the positive grid potential supplied to tubes 5 and 6 by storage capacitor 32. Grid current flows and, at least to a first approximation, the internal impedance of each tube between cathode and control grid is inversely proportional to the current magnitude. In other words, the more positive the bias and the greater the magnitude of the grid current, the lower is the impedance provided by the grid-cathode paths of tubes 5 and 6 in shunt across the amplifier input. In this manner, the detected pulse peak is amplified just enough to reach the point of increasing the shunt loss across the main amplifier input by applying a positive voltage to storage capacitor 32.

The operation of the peak detector formed by tube 24 and the associated circuitry is somewhat similar to the delayed automatic volume control of radio receivers and is advantageous in that it provides extremely close regulation of the amplifier output. Since only that portion of the output which exceeds the desired value is used, very high gain may be employed in the feedback loop so that a very small excess output will reduce the forward gain of the amplifier substantially.

As has already been indicated, a principal advantage of the present invention is the elimination of any requirement that special remote-cutoff or variable-mu tubes be used in those stages of an amplifier to which an automatic gain control voltage is applied. Ordinary triodes or sharp-cutoff pentodes may be readily used without adverse effect on the linear operation of the automatic gain control circuit even over wide ranges of input signal amplitude. Particularly with the push-pull amplifier arrangement illustrated, the resulting operation is substantially linear over its entire input signal volume range.

It is to be understood that the above-described arrangement is illustrative of the application of the principles of the invention. Numerous other arrangements may be devised by those skilled in the art without departing from the spirit and scope of the invention.

What is claimed is:

1. In combination, an electron tube having an anode, a cathode and a control grid, a signal input circuit including a serially connected two terminal resistor, means connecting said input circuit between said control grid and said cathode, a signal output circuit connected to said anode and said cathode, means connected to said output circuit for producing a positive potential only when the amplified signal appearing in the output circuit exceeds a predetermined amplitude, a capacitor, means connecting said capacitor to said positive potential producing means for storing the positive potential, and means for applying the stored positive potential to the resistor terminal more remote from said grid.

2. In combination, an electron tube having an anode, a cathode and a control grid, a signal input circuit, a resistor having a pair of terminals, means connecting one of said resistor terminals to said input circuit and the other of said resistor terminals to said control grid, a signal output circuit connected between said anode and said cathode, rectifying means connected to said output circuit for producing a positive potential only when the amplified signal appearing in the output circuit exceeds a predetermined amplitude, a capacitor, means connecting said capacitor to said rectifying means for storing the positive potential, and means for applying the stored positive potential to said resistor terminal connected to said input circuit.

References Cited in the file of this patent

UNITED STATES PATENTS

| | | |
|---|---|---|
| 1,878,743 | Wheeler | Sept. 20, 1932 |
| 1,985,352 | Numans | Dec. 25, 1934 |
| 2,269,540 | Loughren | Jan. 13, 1942 |
| 2,346,020 | Gillespie | Apr. 4, 1944 |
| 2,505,550 | Ketchledge | Apr. 25, 1950 |
| 2,538,772 | Ferrill | Jan. 23, 1951 |